(12) United States Patent
Tomohiro

(10) Patent No.: US 6,721,231 B2
(45) Date of Patent: Apr. 13, 2004

(54) SEMICONDUCTOR MEMORY DEVICE, MEMORY SYSTEM AND ELECTRONIC INSTRUMENT

(75) Inventor: Yasuhiko Tomohiro, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/306,832

(22) Filed: Nov. 27, 2002

(65) Prior Publication Data
US 2003/0123315 A1 Jul. 3, 2003

(30) Foreign Application Priority Data
Dec. 4, 2001 (JP) ........................................ 2001-370214

(51) Int. Cl.[7] ................................................ G11C 8/00
(52) U.S. Cl. .................................. 365/230.03; 365/226
(58) Field of Search ............................. 365/230.03, 226, 365/230.06, 189.04

(56) References Cited

U.S. PATENT DOCUMENTS 5,142,492 A    8/1992  Shimizu et al.
5,901,103 A  * 5/1999  Harris et al. ................. 365/226

OTHER PUBLICATIONS

U.S. patent application Ser. No. 10/318,271, Karasawa, filed Dec. 12, 2002.
U.S. patent application Ser. No. 10/313,910, Miyashita et al., filed Dec. 6, 2002.

* cited by examiner

Primary Examiner—David Lam
(74) Attorney, Agent, or Firm—Hogan & Hartson, LLP

(57) ABSTRACT

A semiconductor memory device has a plurality of memory block areas, a first power source line and a second power source line for supplying the same potential as the first power source line. At least one of the memory block areas is connected to the first power source line, and at least one of the other memory block areas is connected to the second power source line. For example, when the semiconductor memory device includes four memory block areas, one of two memory block areas simultaneously selected is connected to the first power source line, and the other is connected to the second power source line. Further, one of the other two memory block areas simultaneously selected is connected to the first power source line and the other is connected to the second power source line.

18 Claims, 8 Drawing Sheets

SEMICONDUCTOR MEMORY DEVICE, MEMORY SYSTEM AND ELECTRONIC INSTRUMENT

Japanese Patent Application No. 2001-370214 filed on Dec. 4, 2001 is hereby incorporated by reference in its entirety.

BACKGROUND OF THE INVENTION

The present invention relates to a semiconductor memory device, a memory system and an electronic instrument having a plurality of memory block areas.

As shown in FIG. 8, a semiconductor memory device 500 generally has a memory block area 510 and a power source line 520. The power source line 520 is connected to each memory block area 510 and a power voltage is supplied to a memory cell of the memory block area 510.

BRIEF SUMMARY OF THE INVENTION

The present invention may provide a semiconductor memory device, a memory system and an electronic instrument for improving electric characteristics of the semiconductor memory device.

A semiconductor memory device according to the first aspect of the present invention comprises a plurality of memory block areas, a first power source line, and a second power source line electrically separated from the first power source line, the second power source line supplying a potential of which level is equal to the first power source line. The memory block areas include two memory block areas which are simultaneously selected. The first power source line is connected to one of the two memory block areas. The second power source line is connected to the other of the two memory block areas.

In this semiconductor memory device, the two memory block areas simultaneously selected are respectively connected to the first and second power source lines electrically separated from each other. Therefore, noises transmitted onto each of the first and second power source lines are reduced, and a peak current and a steady-state current flowed to each of the first and second power source lines are also reduced. As a result, the electric characteristics of the semiconductor memory device can be improved.

In this semiconductor memory device, the memory block areas may include a plurality of first memory block areas and a plurality of second memory block areas. In this case, the first power source line may be connected to the first memory block areas, and the second power source line may be connected to the second memory block areas. Further, two or more of the first memory block areas may not be simultaneously selected, and two or more of the second memory block areas may not be simultaneously selected. One of the first memory block areas and one of the second memory block areas may be simultaneously selected. By means of this, advantages obtained by the above-described aspect can also be obtained.

In this semiconductor memory device, each of the first and second power source lines may extend along a first direction, and the semiconductor memory device may be divided into first and second areas in the first direction. In this case, the first area may include one of the first memory block areas and one of the second memory block areas, and the second area may include another one of the first memory block areas and another one of the second memory block areas.

In this semiconductor memory device, the two first memory block areas in the first and second areas may be arranged on the side of one of the first and second power source lines, and the two second memory block areas in the first and second areas may be arranged on the side of the other of the first and second power source lines. Otherwise, the first power source line may be provided between the second power source line and the two first memory block areas in the first and second areas, and the second power source line may be provided between the first power source line and the two second memory block areas in the first and second areas.

In this case, the length of a connecting wiring layer for connecting the first power source line with the first memory block area can be minimized. Further, the length of a connecting wiring layer for connecting the second power source line with the second memory block area can be minimized.

In this configuration, the one of the first memory block areas and the another one of the second memory block areas may be simultaneously selected, and the another one of the first memory block areas and the one of the second memory block areas may be simultaneously selected.

As another configuration, the one of the first memory block areas may be provided on the side of one of the first and second power source lines, and the another one of the first memory block areas may be provided on the side of the other of the first and second power source lines. In this case, the one of the second memory block areas may be provided on the side of the other of the first and second power source lines, and the another one of the second memory block areas may be provided on the side of the one of the first and second power source lines. Further, the first and second power source lines may have a crossing portion as viewed form a vertical direction. In this case, the length of a connecting wiring layer for connecting the first power source line with the first memory block area can also be minimized. Further, the length of a connecting wiring layer for connecting the second power source line and the second memory block area can be also set to be shortest.

In this semiconductor memory device, a first terminal group may be arranged along a second direction crossing the first direction at one end in the first direction, and a second terminal group may be arranged along the second direction at the other end in the first direction. The first terminal group may include a terminal for inputting and outputting data of the one of the first memory block areas and the one of the second memory block areas, and the second terminal group may include a terminal for inputting and outputting data of the another one of the first memory block areas and the another one of the second memory block areas.

Further, when the number of bits simultaneously read or written is 2N, the first terminal group may include N-terminals for inputting and outputting data, and the second terminal group may include N-terminals for inputting and outputting data.

In this semiconductor memory device, a data input-output circuit may be provided on one end of the first area in the first direction and on the side of the first terminal group in each of the one of the first memory block areas and the one of the second memory block areas within the first area. This can minimize the distances from the data input-output circuits to the first and second terminal groups.

In this semiconductor memory device, a decoder may be provided at a boundary between the first and second areas. In this case, the first and second terminal groups may further include an address terminal for inputting an address signal. The decoder may be connected to the address terminal and decode the address signal. Therefore, the distances between each address terminal and the decoder can be equalized and the delay of a signal can be reduced.

In this semiconductor memory device, the first and second terminal groups may further include a command terminal for inputting a command signal. In this case, the decoder may be connected to the command terminal and decode the command signal.

As another configuration, the semiconductor memory device may be divided into first and second areas in a first direction, and the one of the first memory block areas may be provided in the first area, and the one of the second memory block areas may be provided in the second area.

The above described memory block areas may be formed of a plurality of sub-blocks. Each of these sub-blocks may be formed by dividing each of the memory block areas in the second direction.

Further, a memory cell forming the memory block areas may be a SRAM.

A memory system according to the second aspect of the present invention comprises the semiconductor memory device according to the first aspect of the present invention described above. Further, an electronic instrument according to the third aspect of the present invention comprises the semiconductor memory device according to the first aspect of the present invention described above.

DETAILED DESCRIPTION OF THE EMBODIMENT

Figure 1:
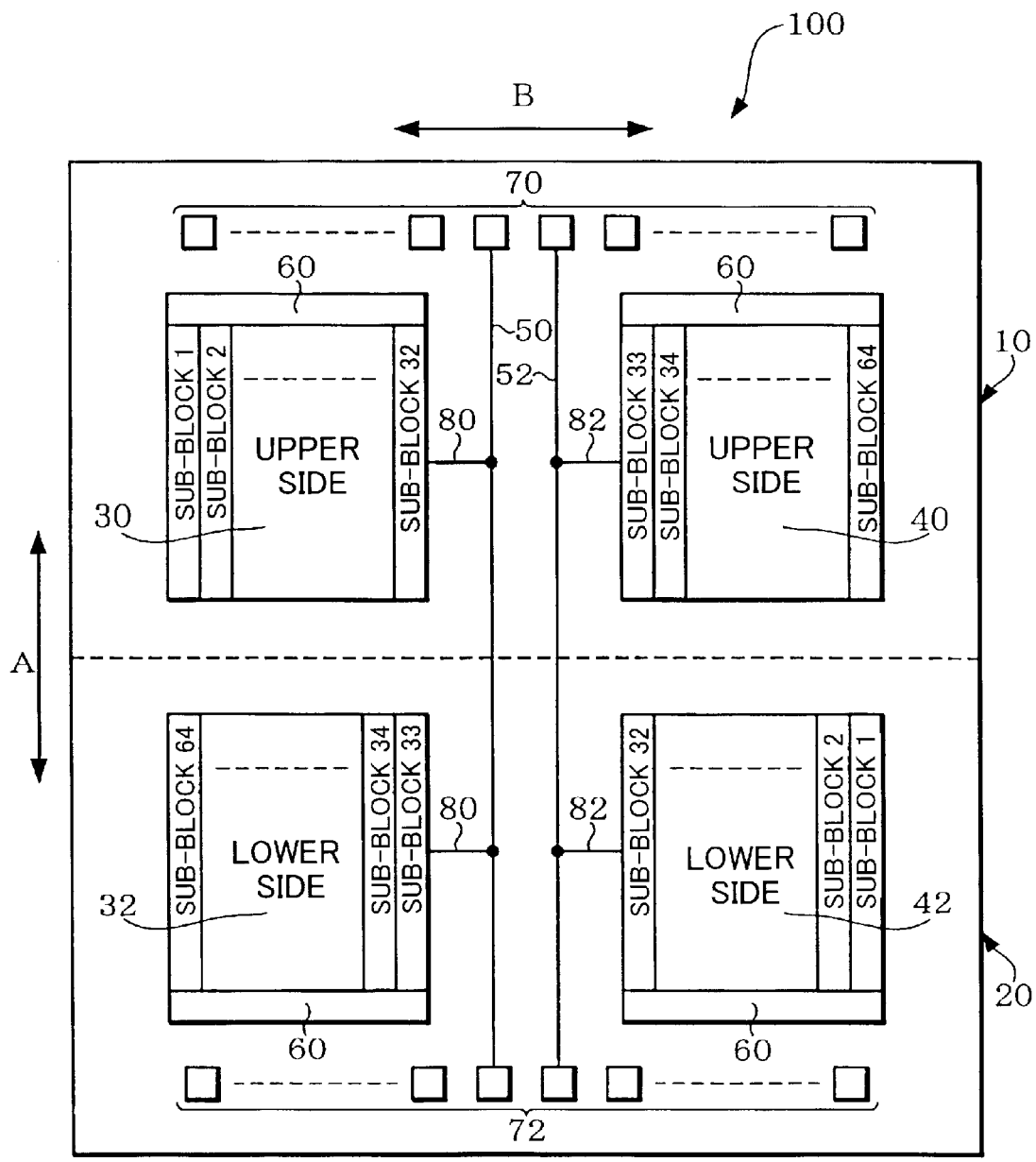
FIG. 1 is a plan view typically showing the plane of a semiconductor memory device.
Figure 2:
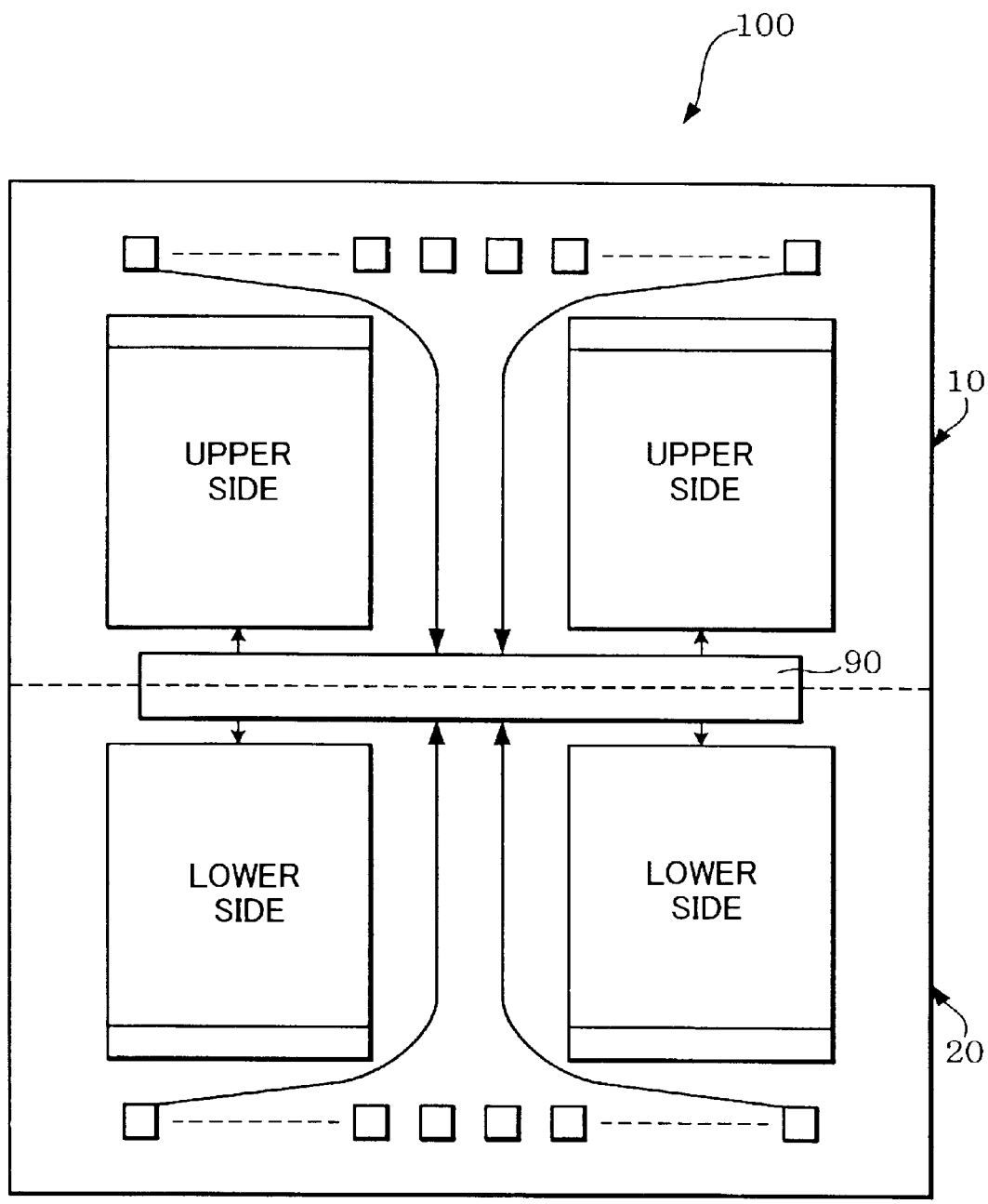
FIG. 2 is a plan view typically showing the plane of the semiconductor memory device.

Embodiments of the present invention will now be described in more detail with reference to the accompanying figures.
Construction of Semiconductor Memory Device FIGS. 1 and 2 are plan views typically showing the plane of a semiconductor memory device.

A semiconductor memory device 100 has two first memory block areas 30, 32, two second memory block areas 40, 42, and first and second power source lines 50, 52 for supplying power source potentials at the same level to the respective memory block areas. These first and second power source lines 50, 52 are electrically separated from each other.

The first and second power source lines 50, 52 are arranged so as to be extended along a first direction A. The two first memory block areas 30, 32 are arranged on the left-hand side (one side) of the first and second power source lines 50, 52. The two second memory block areas 40, 42 are arranged on the right-hand side (the other side) of the first and second power source lines 50, 52.

The two first memory block areas 30, 32 are connected to the first power source line 50 through a connecting wiring layer 80. The two second memory block areas 40, 42 are connected to the second power source line 52 through a connecting wiring layer 82.

The first power source line 50 is arranged between the two first memory block areas 30, 32 and the second power source line 52. Thus, the connecting wiring layer 80 can be connected to the first power source line 50 without crossing the second power source line 52 so that the length of the connecting wiring layer 80 can be set to be shortest.

The second power source line 52 is arranged between the two second memory block areas 40, 42 and the first power source line 50. Thus, the connecting wiring layer 82 can be connected to the second power source line 52 without crossing the first power source line 50 so that the length of the connecting wiring layer 82 can be set to be shortest.

The semiconductor memory device 100 is divided into a first area 10 and a second area 20 in the first direction A. The first memory block area 30 on the upper side and the second memory block area 40 on the upper side are arranged in the first area 10. The first memory block area 32 on the lower side and the second memory block area 42 on the lower side are arranged in the second area 20.

A first terminal group 70 is arranged along a second direction B in an end portion of the semiconductor memory device 100 in the first area 10. The first terminal group 70 includes terminals for inputting and outputting data of the first and second memory block areas 30, 40 on the upper side. Therefore, data are inputted and outputted through the first terminal group 70 in the memory block areas 30, 40 on the upper side in the first area 10.

A second terminal group 72 is arranged along the second direction B in an end portion of the semiconductor memory device 100 in the second area 20. The second terminal group 72 includes a terminal for inputting and outputting data of the first and second memory block areas 32, 42 on the lower side. Therefore, data are inputted and outputted through the second terminal group 72 in the memory block areas 32, 42 on the lower side in the second area 20.

Further, each of the first and second terminal groups 70, 72 can include an address terminal (including a terminal for inputting a block selecting signal) for inputting an address signal, and a command terminal for inputting a command signal in accordance with necessity.

When the number of bits simultaneously read or written is set to 2N (e.g., 16), the first terminal group 70 can include N (e.g., 8) terminals for inputting and outputting data of the memory block areas 30, 40 on the upper side. Further, the second terminal group 72 can include N (e.g., 8) terminals for inputting and outputting data of the memory block areas 32, 42 on the lower side.

A data input-output circuit 60 is arranged every memory block area. Each data input-output circuit 60 can be arranged between the memory block area and the terminal group for inputting and outputting data of this memory block area. When the first memory block area 30 on the upper side is set to an example, the data input-output circuit 60 can be arranged between this memory block area 30 and the first terminal group 70. In this case, the distance from the data input-output circuit 60 to the terminal can be set to be shortest. The data input-output circuit 60 includes a circuit for supplying a potential to a bit line in writing of the data of a sense amplifier.

As shown in FIG. 2, a decoder 90 is arranged in a boundary area of the first area 10 and the second area 20. The decoder 90 is connected to the address terminal (including a terminal for inputting the block selecting signal) and the command terminal. The decoder 90 delivers a predetermined signal to each memory block area on the basis of a signal inputted from the address terminal and the command terminal.

A memory cell constituting the memory block area is not particularly limited if this memory cell has a memory function. For example, the memory cell can be set to a SRAM and a DRAM.

As shown in FIG. 1, each memory block area can be constructed by dividing each memory block area into a plurality of, e.g., 32 sub-blocks in the second direction B.

Operational Explanation

In this embodiment, when data of the semiconductor memory device 100 are inputted and outputted, the first memory block area 30 on the upper side and the second memory block area 42 on the lower side are simultaneously selected, and the first memory block area 32 on the lower side and the second memory block area 40 on the upper side are simultaneously selected. Namely, the memory block areas diagonally located are simultaneously selected, and no memory block areas connected to the same power source line are simultaneously selected. When the reading of data is set to an example and the first memory block area 30 on the upper side and the second memory block area 42 on the lower side are simultaneously selected, for example, data of 8 bits are read from the first memory block area 30 on the upper side through the first terminal group 70. Further, for example, data of 8 bits are read from the second memory block area 42 on the lower side through the second terminal group 72. Thus, for example, data of 16 bits in total are read.

Operational Effect

The operational effects in accordance with this embodiment will next be described.

(1) In this embodiment, two memory block areas simultaneously selected are connected to different power source lines. Accordingly, no memory block areas connected to the same power source line are simultaneously selected. Thus, the following effects are obtained in comparison with a case in which the two memory block areas simultaneously selected are connected to the same power source line. a) Noises transmitted onto each of the power source lines 50, 52 can be reduced. b) A peak current flowed to each of the power source lines 50, 52 can be reduced. c) A steady-state current flowed to each of the power source lines 50, 52 can be reduced to half.

The electric characteristics of the semiconductor memory device can be improved from the above contents.

Further, since the peak current and the steady-state current can be reduced, electro-migration can be restrained.

(2) It is possible to equalize the distance from each terminal to each memory block area via the decoder 90 by arranging the decoder 90 in the boundary area of the first area 10 and the second area 20. Therefore, the delay of a signal can be restrained.

Modified Example (1) In the above embodiment, the number of memory block areas is set to four. However, this number is not limited to four, but can be set to an arbitrary plural number.

Figure 3:
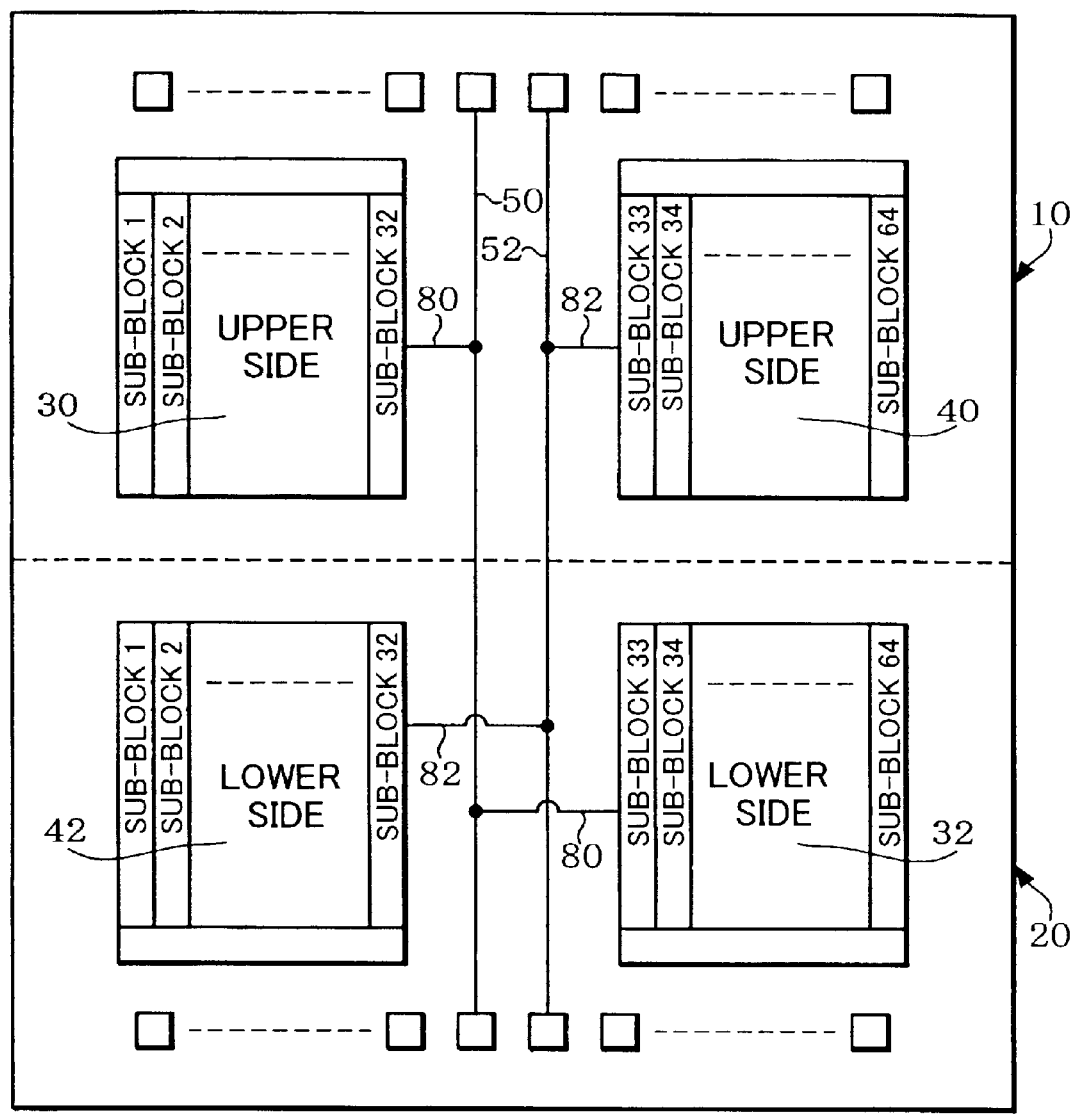
FIG. 3 is a plan view typically showing the plane of a modified example of the semiconductor memory device.

(2) As shown in FIG. 3, the first memory block area 32 on the lower side may be arranged on the right-hand side of the power source lines 50, 52, and the second memory block area 42 on the lower side may be also arranged on the left-hand side of the power source lines 50, 52. In the case of this mode, the connecting wiring layer 80 of the first power source line 50 and the first memory block area 32 on the lower side crosses the second power source line 52 in a plane. Further, the connecting wiring layer 82 of the second power source line 52 and the second memory block area 42 on the lower side crosses the first power source line 50 in a plane.

Figure 4:
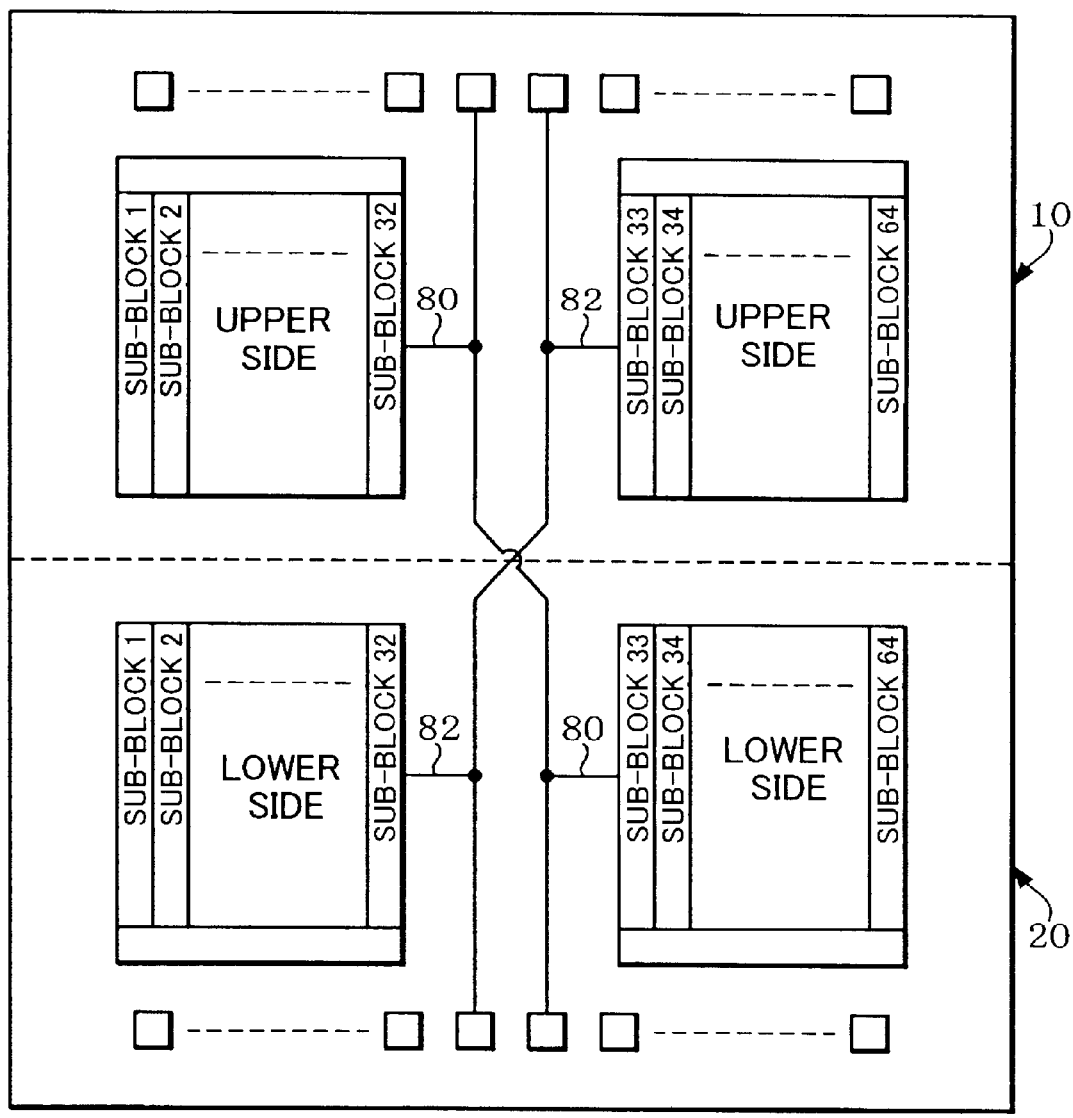
FIG. 4 is a plan view typically showing the plane of a modified example of the semiconductor memory device.

Further, in this modified example, as shown in FIG. 4, the first power source line 50 and the second power source line 52 may cross each other in a plane in a central portion of the semiconductor memory device. Thus, each of the connecting wiring layers 80, 82 can be set to be shortest since it is not necessary to make each of the connecting wiring layers 80, 82 cross one power source line in a plane in the second area 20.

Figure 5:
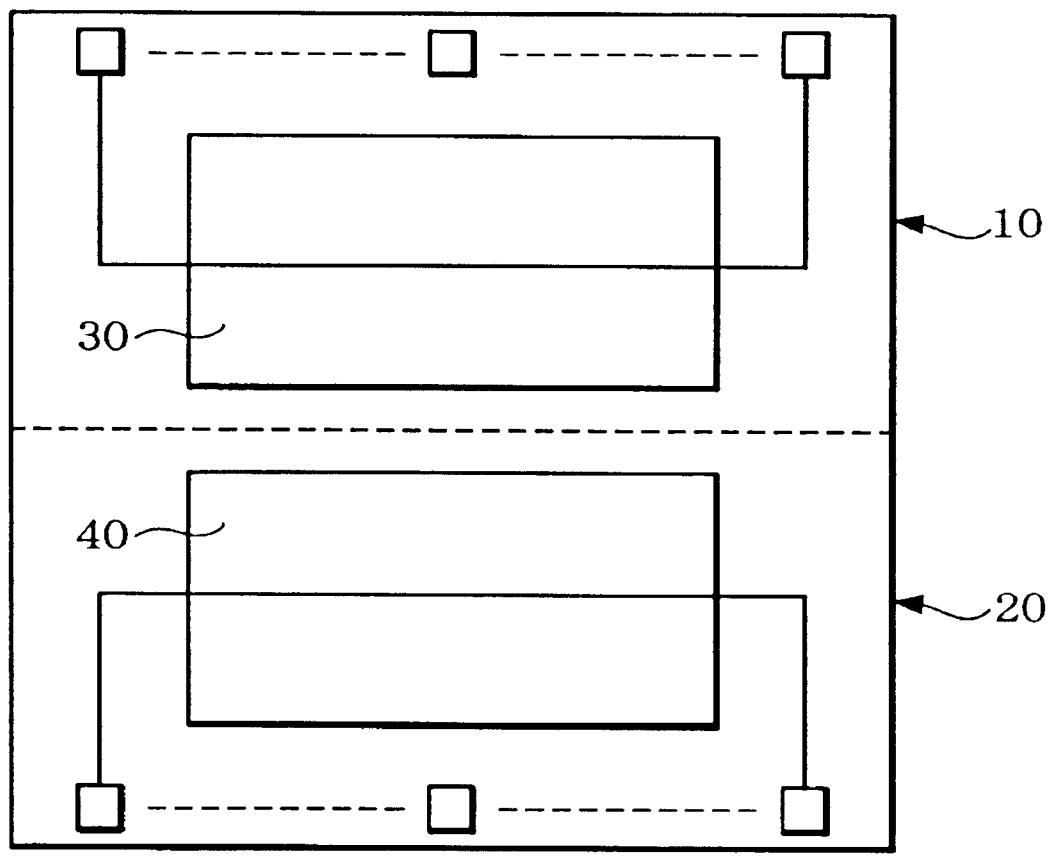
FIG. 5 is a plan view typically showing the plane of a modified example of the semiconductor memory device.

(3) As shown in FIG. 5, one first memory block area 30 may be arranged in the first area 10, and one second memory block area 40 may be arranged in the second area 20, and the power source lines 50, 52 electrically separated from each other may be also connected to the respective memory block areas. These first and second memory block areas 30, 40 are also simultaneously selected.

Application Example of Semiconductor Memory Device

Figure 6:
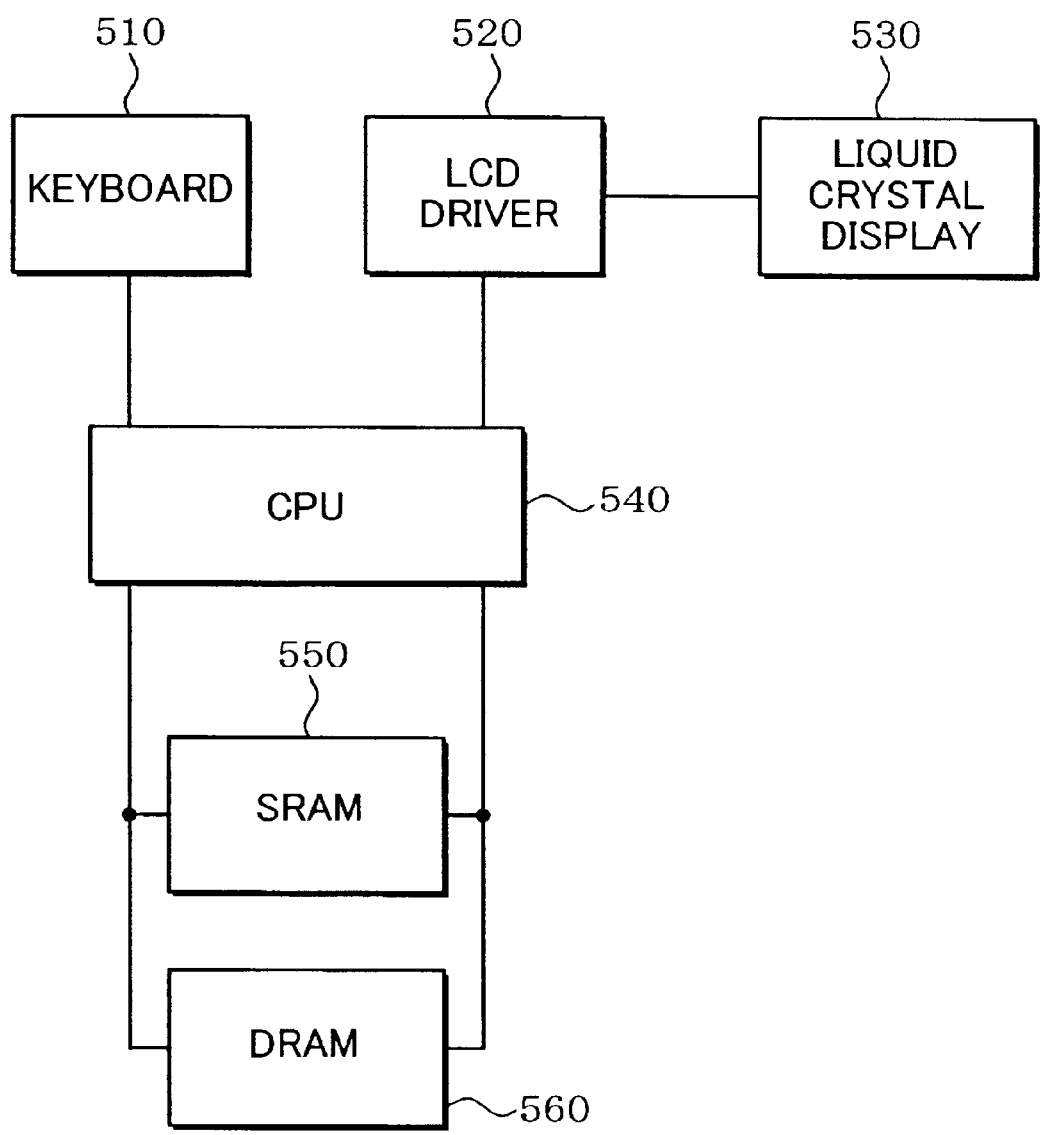
FIG. 6 is a block diagram of part of the system of a portable telephone set including a SRAM in accordance with the embodiment of the present invention.

When the semiconductor memory device in accordance with this embodiment is a SRAM, the semiconductor memory device can be applied to e.g., an electronic instrument such as a portable device. FIG. 6 is a block diagram of part of the system of a portable telephone set. A CPU 540, a SRAM 550 and a DRAM 560 are mutually connected by bus lines. Further, the CPU 540 is connected to a keyboard 510 and an LCD driver 520 by bus lines. The LCD driver 520 is connected to a liquid crystal display section 530 by a bus line. A memory system is formed by the CPU 540, the SRAM 550 and the DRAM 560.

Figure 7:
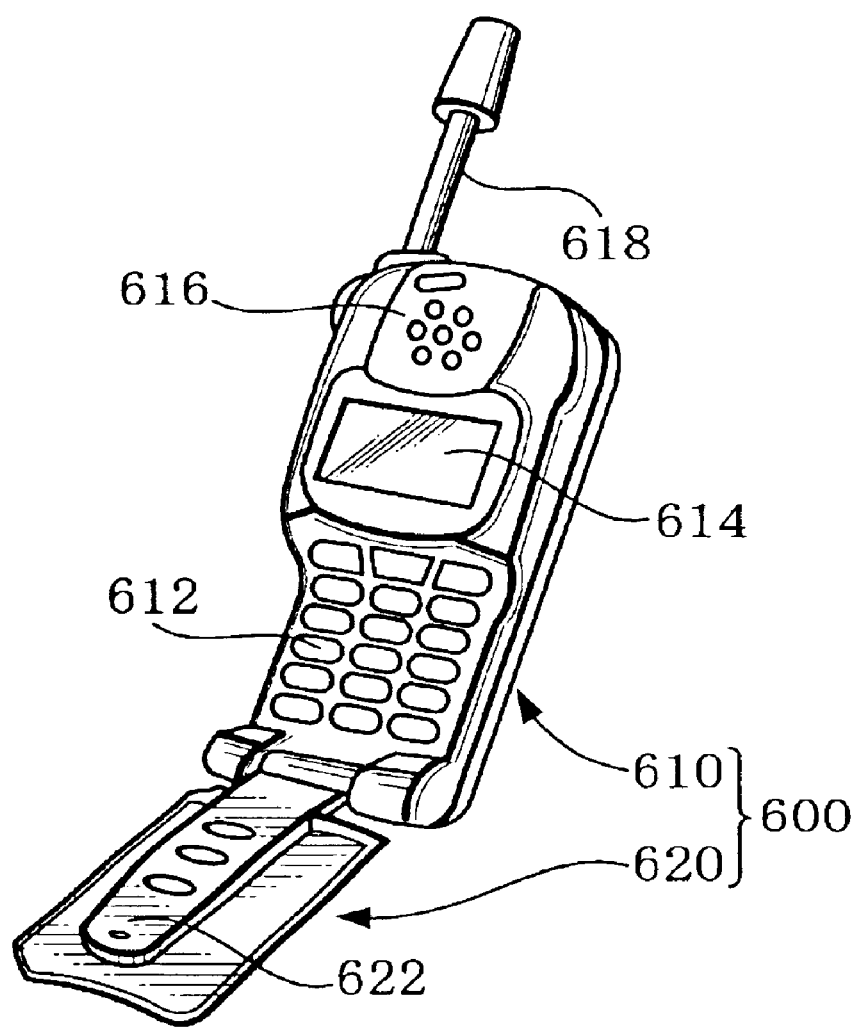
FIG. 7 is a perspective view of the portable telephone set including the system of the portable telephone set shown in FIG. 6.
Figure 8:
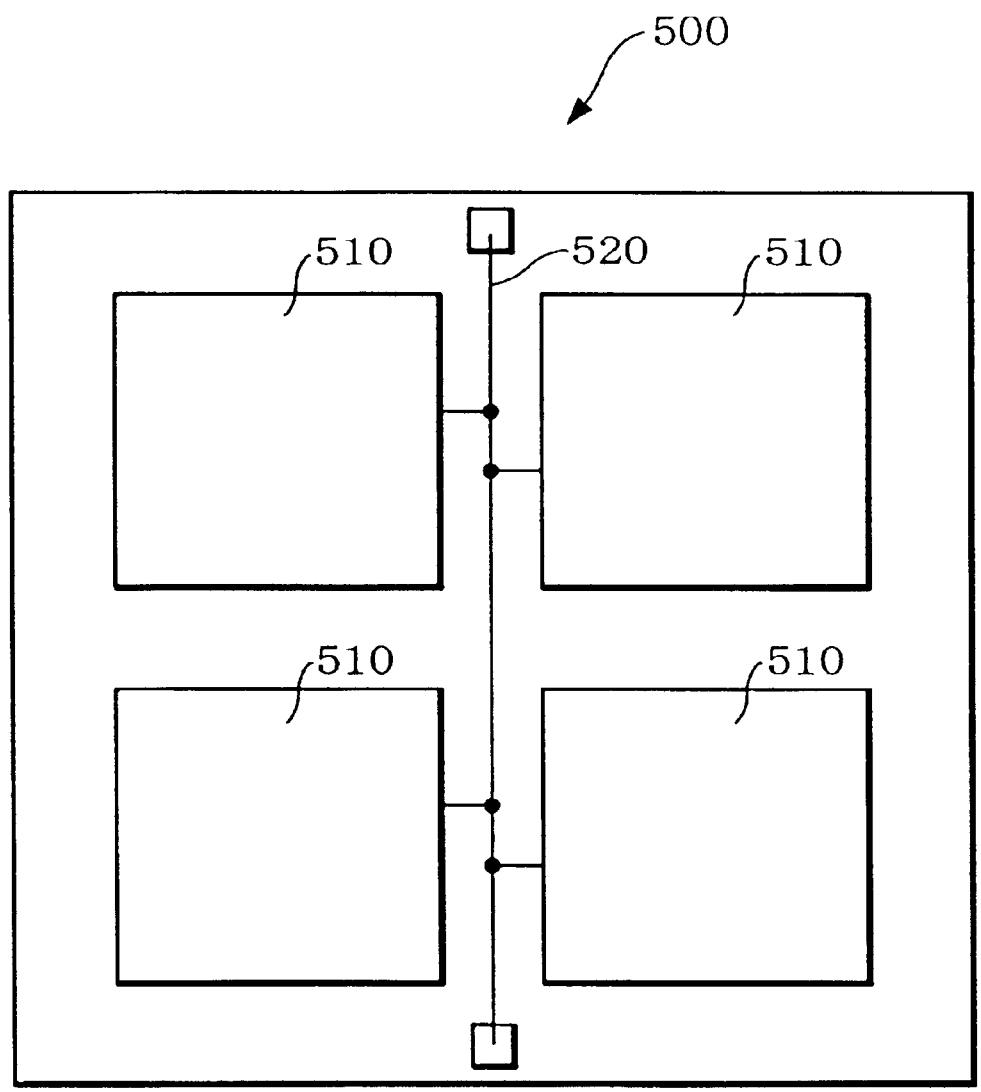
FIG. 8 is a plan view typically showing the plane of a semiconductor memory device in a conventional example.

FIG. 7 is a perspective view of the portable telephone set 600 having the system of the portable telephone set shown in FIG. 6. The portable telephone set 600 has a main body section 610 including a keyboard 612, a liquid crystal display portion 614, a receiving portion 616 and an antenna portion 618, and a cover section 620 including a transmitting portion 622.

The semiconductor memory device is not limited to the application of the portable telephone set, but can be applied to various electronic instrument such as a note type personal computer, an electronic note, a pager, an electronic calculator, a POS terminal, an IC card, and a minidisk player, as well as a wristwatch and a portable information device.

The present invention is not limited to the above embodiments, but can be variously modified in the scope not departing from the gist of the present invention.

What is claimed is:

1. A semiconductor memory device comprising:
   a plurality of memory block areas;
   a first power source line; and
   a second power source line electrically separated from the first power source line, the second power source line supplying a potential of which level is equal to the first power source line,
   wherein the memory block areas include two memory block areas which are simultaneously selected,
   wherein the first power source line is connected to one of the two memory block areas, and
   wherein the second power source line is connected to the other of the two memory block areas.

2. The semiconductor memory device as defined in claim 1,
   wherein the memory block areas include a plurality of first memory block areas and a plurality of second memory block areas, wherein the first power source line is connected to the first memory block areas, wherein the second power source line is connected to the second memory block areas, and wherein two or more of the first memory block areas are not simultaneously selected, and two or more of the second memory block areas are not simultaneously selected, and one of the first memory block areas and one of the second memory block areas are simultaneously selected.

3. The semiconductor memory device as defined in claim 2, wherein each of the first and second power source lines extends along a first direction, wherein the semiconductor memory device is divided into first and second areas in the first direction, wherein the first area includes one of the first memory block areas and one of the second memory block areas, and wherein the second area includes another one of the first memory block areas and another one of the second memory block areas.

4. The semiconductor memory device as defined in claim 3, wherein the two first memory block areas in the first and second areas are arranged on the side of one of the first and second power source lines, and wherein the two second memory block areas in the first and second areas are arranged on the side of the other of the first and second power source lines.

5. The semiconductor memory device as defined in claim 3, wherein the first power source line is provided between the second power source line and the two first memory block areas in the first and second areas, and wherein the second power source line is provided between the first power source line and the two second memory block areas in the first and second areas.

6. The semiconductor memory device as defined in claim 3, wherein the one of the first memory block areas and the another one of the second memory block areas are simultaneously selected, and wherein the another one of the first memory block areas and the one of the second memory block areas are simultaneously selected.

7. The semiconductor memory device as defined in claim 3, wherein the one of the first memory block areas is provided on the side of one of the first and second power source lines, wherein the another one of the first memory block areas is provided on the side of the other of the first and second power source lines, wherein the one of the second memory block areas is provided on the side of the other of the first and second power source lines, and wherein the another one of the second memory block areas is provided on the side of the one of the first and second power source lines.

8. The semiconductor memory device as defined in claim 7, wherein the first and second power source lines have a crossing portion as viewed from a vertical direction.

9. The semiconductor memory device as defined in claim 3, wherein a first terminal group is arranged along a second direction crossing the first direction at one end in the first direction, wherein a second terminal group is arranged along the second direction at the other end in the first direction, wherein the first terminal group includes a terminal for inputting and outputting data of the one of the first memory block areas and the one of the second memory block areas, and wherein the second terminal group includes a terminal for inputting and outputting data of the another one of the first memory block areas and the another one of the second memory block areas.

10. The semiconductor memory device as defined in claim 9, wherein, when the number of bits simultaneously read or written is 2N, the first terminal group includes N-terminals for inputting and outputting data, and the second terminal group includes N-terminals for inputting and outputting data.

11. The semiconductor memory device as defined in claim 9, wherein a data input-output circuit is provided on one end of the first area in the first direction and on the side of the first terminal group in each of the one of the first memory block areas and the one of the second memory block areas within the first area.

12. The semiconductor memory device as defined in claim 9, wherein a decoder is provided at a boundary between the first and second areas, wherein the first and second terminal groups further include an address terminal for inputting an address signal, and wherein the decoder is connected to the address terminal.

13. The semiconductor memory device as defined in claim 12, wherein the first and second terminal groups further include a command terminal for inputting a command signal, and wherein the decoder is connected to the command terminal.

14. The semiconductor memory device as defined in claim 9, wherein each of the memory block areas has a plurality of sub-blocks, and wherein the sub-blocks are formed by dividing each of the memory block areas in the second direction.

15. The semiconductor memory device as defined in claim 2, wherein the semiconductor memory device is divided into first and second areas in a first direction, wherein the one of the first memory block areas is provided in the first area, wherein the one of the second memory block areas is provided in the second area, and wherein the first and second power source lines are provided so as to extend along a second direction crossing the first direction.

16. The semiconductor memory device as defined in claim 1, wherein a memory cell forming each of the memory block areas is a SRAM.

17. A memory system comprising the semiconductor memory device as defined in claim 1.

18. An electronic instrument comprising the semiconductor memory device as defined in claim 1.

* * * * *